(12) United States Patent
Mohler

(10) Patent No.: US 6,324,063 B1
(45) Date of Patent: Nov. 27, 2001

(54) DECENTRALIZED MODULE FOR JOINING AND DISTRIBUTING SIGNAL LINES

(75) Inventor: Harald Mohler, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/380,930

(22) PCT Filed: Feb. 27, 1998

(86) PCT No.: PCT/DE98/00580

§ 371 Date: Jan. 12, 2000

§ 102(e) Date: Jan. 12, 2000

(87) PCT Pub. No.: WO98/41075

PCT Pub. Date: Sep. 17, 1998

(30) Foreign Application Priority Data

Mar. 10, 1997 (DE) ............................................. 297 04 307

(51) Int. Cl.[7] ....................................................... H05K 7/00
(52) U.S. Cl. .............................................................. 361/728
(58) Field of Search ..................................... 361/728, 715, 361/718, 719, 720, 736, 737, 729, 730

(56) References Cited

U.S. PATENT DOCUMENTS

| 4,985,845 | * | 1/1991 | Gotz et al. ............................ 364/492 |
| 5,043,847 |   | 8/1991 | Deinhardt et al. |
| 5,249,979 |   | 10/1993 | Deinhardt et al. |
| 5,313,372 | * | 5/1994 | Chabert et al. ...................... 361/823 |
| 5,323,296 | * | 6/1994 | Gasser et al. ........................ 361/736 |

FOREIGN PATENT DOCUMENTS

| 89 10 111.1 | 11/1989 | (DE) . |
| 39 32 005 | 4/1990 | (DE) . |
| 92 18 583.5 | 10/1994 | (DE) . |
| 44 10 171 | 4/1995 | (DE) . |
| 44 38 806 | 3/1996 | (DE) . |
| 296 07 525 | 8/1996 | (DE) . |
| 0 323 579 | 7/1989 | (EP) . |
| 0 536 560 | 4/1993 | (EP) . |
| 0 550 324 | 7/1993 | (EP) . |
| 0 710 064 | 5/1996 | (EP) . |

OTHER PUBLICATIONS

Engineering & Automation (Siemens), "ALFA Tackles CIM", 13 (1991) May/Jun., No. 3, pp. 32–35.

* cited by examiner

*Primary Examiner*—Tulsidas Patel
(74) *Attorney, Agent, or Firm*—Staas & Halsey LLP

(57) ABSTRACT

The decentralized module has a flat base module including at least one electrical interface for connecting the decentralized module to at least one databus, a connection module for signal lines, which connection module can be releasably latched onto the base module with electrical contact being made, and an electronic circuit which can be controlled via the databus and by means of which, when the connection module is latched in place, coupling is achieved between the signal lines and the electrical interface of the base module for the databus.

19 Claims, 5 Drawing Sheets

DECENTRALIZED MODULE FOR JOINING AND DISTRIBUTING SIGNAL LINES

BACKGROUND INFORMATION

In automation technology, electronic control systems are used, in particular, for automating technical processes. Conventional electronic control installations have so-called decentralized (distributed) peripheral equipment. This entails electrical process signals being routed, for example from a central programmable computer unit, particularly a programmable controller, via a bus system to control installations having a decentralized design. Such electronic control systems, capable of having a decentralized design, no longer require, in particular, signal lines to be wired centrally in control (switchgear) cabinets, since decentralized, modular terminal blocks can be installed at any desired point in the process to be automated.

European Patent No. EP 0 323 579 describes a decentralized input/output module for electronic control systems. In the middle of this module, a central connector terminal box is provided. On both sides of the connector terminal box, insertion input and output modules can be attached in mirror symmetry around its center line. A plurality of plug connectors are provided on both sides of the central connector terminal box for contacting the input and output modules.

German Patent No. 44 38 806 describes a modular control installation, where connection blocks which are capable of being mounted side-by-side on mounting rails provide signal processing between field devices and an internal bus conductor. In this context, the internal bus conductor can be coupled to a higher-level field bus system. The modular control installation has fixed (modular) terminal blocks adapted to receive a plug-in electronic module. The removable electronic module is used, in particular, for signal processing purposes and is designed to be coupled to a bus system linked to a programmable controller.

The design described in German Patent No. 44 38 806 is disadvantageous because the layout of the terminal region requires a large area and is disorganized, and the attachable electronic module projects upwards to a large extent. Also, the terminal blocks, which lie one above the other in a number of rows, present an extremely confusing wiring appearance. This has the drawback of increasing the rate of wiring errors, and the time needed to plan and design wiring for the control installation.

SUMMARY

An object of the present invention is to provide a more advantageous decentralized module.

One advantage of the decentralized module, according to the present invention, for bringing together and distributing signal lines for electrical process signals is that the electronics can be arranged, in particular, in a flat basic module. This means that the decentralized module according to the present invention has a flat, low overall height. This is an advantage since, in process technology, the space requirement for electronic components, in particular, is an important parameter.

A further advantage is that there is a clear separation between the connection field for electrical interfaces for coupling to a databus, and the removable connection field having electrical connection means for signal lines. The module according to the present invention in this case enables wiring by colors, as is customary in design and planning, i.e., particularly the so-called laying of the signal lines on the basis of the so-called "color scheme". Having a color association between signal lines and terminals makes it possible to build up so-called "fixed wiring" in minimal time, without necessitating additional, redundant visual inspections to check for proper wiring.

A further advantage is that the connection module for the signal lines can be removably attached, in particular latched, to the base module. This means that if there is a fault in the electronics, for example due to thermal overloading, the base module, located behind the connection module and having the electronic circuit arranged in it, is completely replaceable. In this context, the fixed wiring on the connection module is retained, eliminating the need for any time-consuming and error-prone rewiring of the signal lines. It is thus possible to replace the electronics of the decentralized module quickly.

A further advantage is the configuration in an example embodiment of the present invention of the termination panels in the form of cable channels. In a further embodiment of the present invention, the cable channels have (hinged) doors, which are able to swivel to cover the termination panels, the advantageous result being that only those terminal strips which are just about to be wired, for example, are exposed. The doors are labelled on the outside and inside to advantageously facilitate a rapid association between the inscribed text, the terminal strips and the corresponding signal lines.

DETAILED DESCRIPTION

Figure 1:
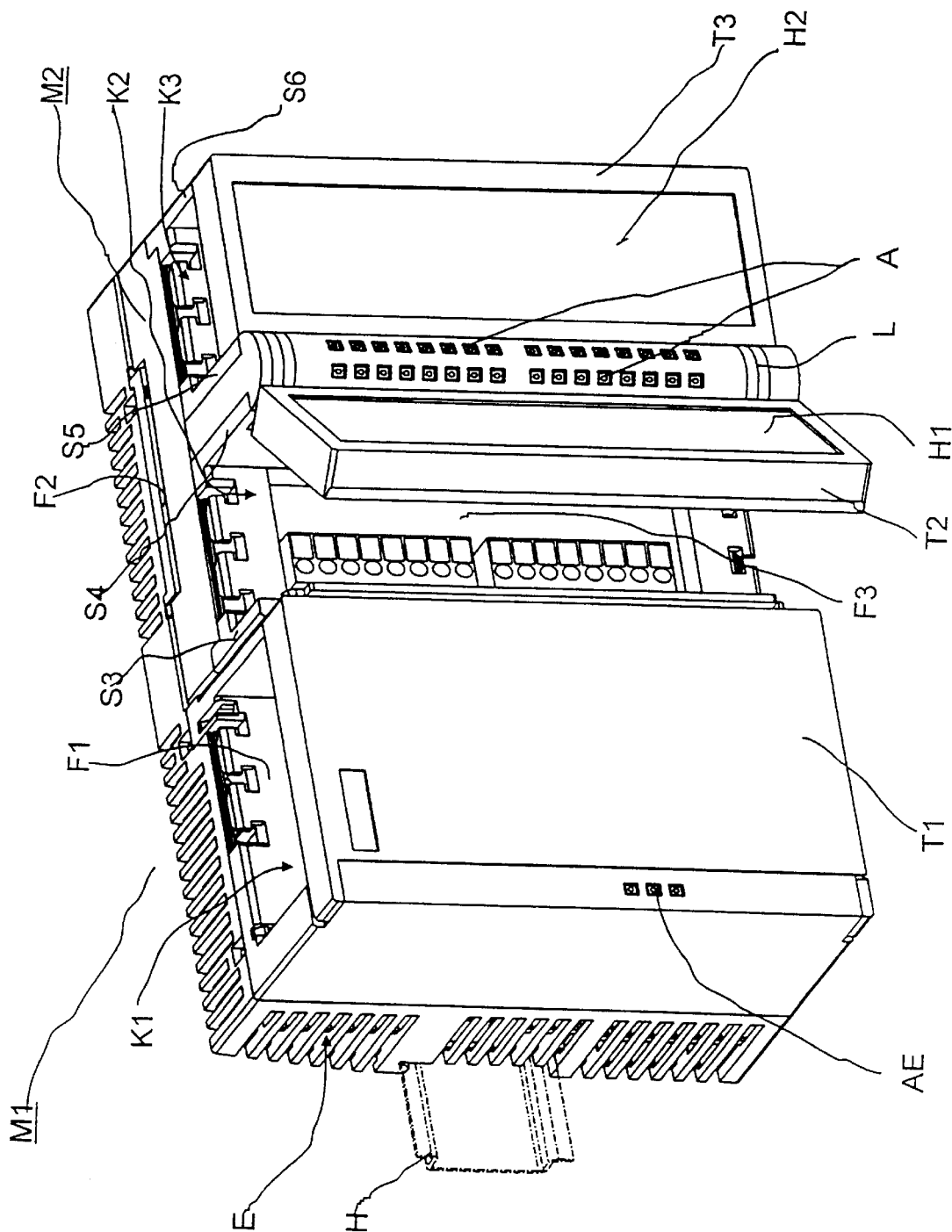
FIG. 1 shows a perspective exemplary illustration of the decentralized module according to the present invention in the unwired state, with an open door exposing a termination panel having electrical connection means for signal lines.
Figure 2:
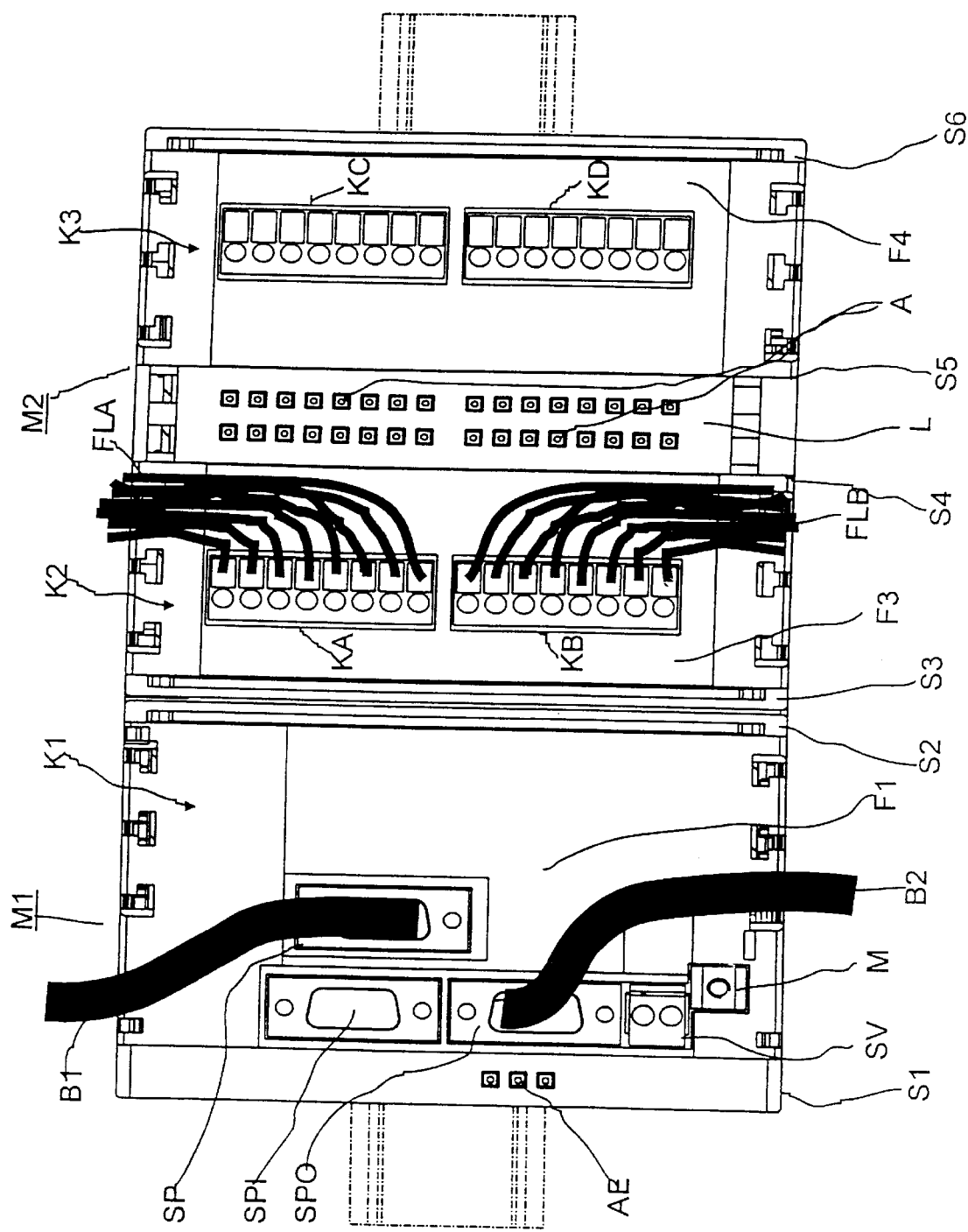
FIG. 2 shows a view of the arrangement of the termination panels when the decentralized module is wired, by way of example, including a databus and signal lines.

FIGS. 1 and 2 are jointly described below. FIG. 1 shows, an example embodiment of the decentralized module according to the present invention for bringing together and distributing signal lines FLA, FLB for electrical process signals. According to the present invention, the decentralized module in this case has a flat base module M1 including at least one electrical interface, shown in FIG. 2 with the reference symbols SP, SPI, SPO, SV and M. It is used, in particular, to connect the decentralized module to at least one databus, denoted by reference symbols B1 and B2. An electrical interface SP can be used, for example, to connect the decentralized module via a databus B1 to a central programmable computer unit, for example a programmable logic controller which is also called "PLC". In addition, further electrical interfaces SPO and SPI can be used via a lower-order databus B2 to connect the decentralized module to other decentralized modules, in particular. This enables so-called "decentralized peripheral equipment" to be constructed, in particular, where decentralized modules can be spatially distributed in any desired manner and coupled to a programmable computer unit via at least one higher- and/or lower-level databus B1 and/or B2.

In addition, besides the flat base module M1, the decentralized module according to the present invention includes, as shown in FIG. 1, a connection module M2 for signal lines FLA and FLB. Here, connection module M2 can be removably attached to base module M1, with electrical contact being made. According to the present invention, the decentralized module additionally has an electronic circuit E, which is preferably arranged in base module M1 and is merely indicated indirectly in FIG. 1. Electronic circuit E an be controlled via the databus denoted by reference symbols B1 and B2 and, in the mounted state of connection module M2, effects a coupling between signal lines FLA and/or FLB and electrical interface SP, SPI, SPO, SV and/or M of base module M1 to higher- and/or lower-level databus B1 and/or B2. Electronic circuit E, which can be controlled via databus B1 and/or B2, can activate the individual signal lines, which are linked to connection module M2 and are denoted by reference symbols FLA and FLB, as input or output signal lines in each case. As a result, during design and planning, all signal lines FLA and FLB can first be linked to connection module M2, for example, and then activated as input or output signal lines via databus B1 and/or B2 using electronic circuit E.

As is further shown in FIG. 1, base module M1 has, in one embodiment of the decentralized module according to the present invention, a first termination panel F1 having the electrical interface(s) denoted by reference symbols SP, SPI, SPO, SV and M and, in particular, designed as plug connectors. In this context, a power supply connection SV and a grounded connection M, for example, are also provided on first termination panel F1 for the decentralized module. Base module M1 can preferably be attached to a fastening element. The fastening element is, for example, in the form of a top-hat rail H onto which base module M1 can be snapped or slid. In addition to first termination panel F1 of the decentralized module, a second termination panel F2 is arranged, in particular, which is used to attach connection module M2 to base module M1 with electrical contact being made.

In a further advantageous embodiment of the decentralized module, connection module M2 has at least a third termination panel F3 having electrical connection means, denoted by reference symbols KA and KB, for signal lines FLA and FLB. As shown in FIG. 2, connection module M2 has, in particular, at least a further, fourth termination panel F4 which is arranged next to third termination panel F3 and has electrical connection means, denoted by reference symbols KC and KD, for signal lines. For reasons of clarity, FIG. 2 in this case shows only signal lines FLA and FLB, which are linked to electrical connection means KA and KB with electrical contact being made. Electrical connection means KA, KB, KC and KD may be designed as terminal strips for making electrical contact with signal lines. In this context, the signal lines are used, in particular, to transmit electrical process signals which may be in digital or analog form, for example.

In a further example embodiment of the decentralized module, first termination panel F1 of base module M1 is designed, on two opposite sides, with a first and a second side wall S1 and S2 to form a first cable channel K1. Accordingly, on connection module M2, third termination panel F3 and/or fourth termination panel F4, in particular, are designed, on two opposite sides, with a third and a fourth side wall S3 and S4 and, respectively, with a fifth and a sixth side wall S5 and S6 to form a second cable channel K2 and, respectively, to form a third cable channel K3. In this context, first, second, third, fourth, fifth and sixth side wall S1 . . . S6 preferably extend approximately parallel to one another, with the result that cable channels K1, K2 and K3 are advantageously accessible on both sides, as shown in FIGS. 1 and 2.

In a further advantageous embodiment, shown in FIG. 1, of the decentralized module, a first door T1 is swing-mounted on the first or second side wall S1 or S2 on base module M1 to cover first cable channel K1. Accordingly, a second door T2 and a third door T3, respectively, are swing-mounted on third or fourth side wall S3 or S4 and, respectively, on fifth or sixth side wall SS or S6, in particular to cover second cable channel K2 and, respectively, third cable channel K3. Second door T2 and third door T3 of removable connection module M2 in this case have inscription areas H1 and H2, in particular on both sides.

As shown in FIG. 1 in one embodiment of the decentralized module, a half-moon-shaped covering strip L is provided which can be attached to fourth and fifth side wall S4 and SS. In this case, the covering strip can be plugged or snap-fitted onto fourth and fifth side walls S4 and SS, or can be attached, if required, in an intermediate space located between the side walls. In addition, in particular, second and third door T2 and T3 for covering second and third cable channel K2 and K3, respectively, are mounted such that they can pivot on the snap-fitting half-moon-shaped covering strip L.

Signal devices A are additionally arranged on the snap-fitting covering strip L. Via connection means KA, KB, KC and KD, these devices are in each case associated with the individual signal lines which are connected to connection module M2 and have, for example, reference symbols FLA and FLB. In this case, signal devices A are used, in particular, to display the electrical process signals transferred on the signal lines. In addition, further signal devices AE, in particular, are arranged on the decentralized module according to the present invention, these signal devices indicating the operational status of the decentralized module or electronic circuit E, for example. In the example in FIG. 1, further signal devices AE are arranged on first side wall S1 of base module M1.

Figure 3:
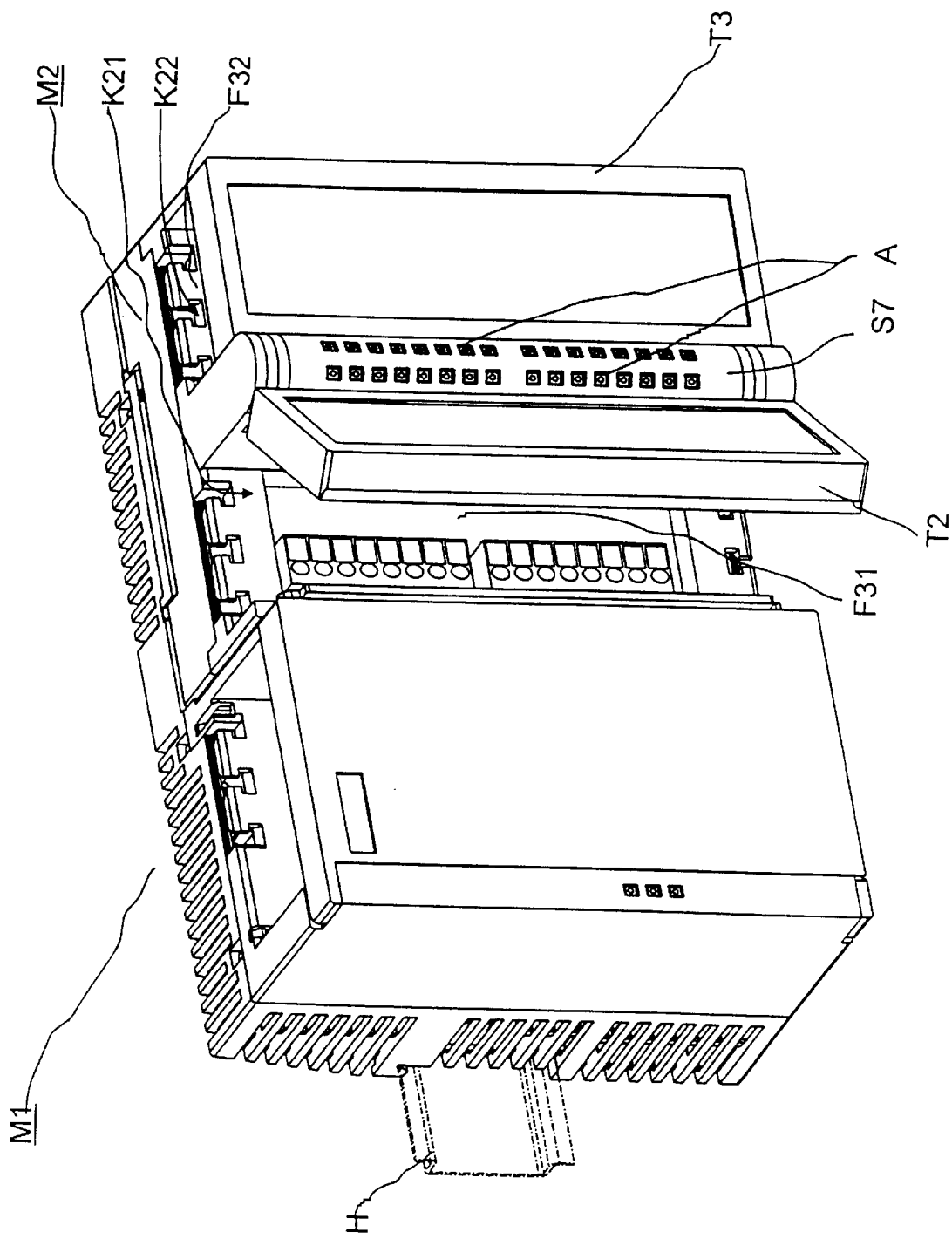
FIG. 3 shows, an example embodiment of the decentralized module according to the present invention in a perspective illustration.

FIG. 3 shows a further advantageous embodiment of the decentralized module, connection module M2 having at least a third termination panel F3 which is divided by a partition S7 having a column form into two panel sections, having reference symbols F31 and F32. In this case, third termination panel F3 is designed, particularly on two opposite sides, with a third and a fourth side wall S3 and S4 to form a second cable channel K2. Second cable channel K2 is in this case divided into two partial cable channels, denoted by reference symbols K21 and K22, by partition S7 having a column form. To cover two partial cable channels K21 and K22, a second and a third door T2 and T3 are swing-mounted on partition S7. Signal devices A are arranged on partition S7 and are each associated with the individual signal lines linked to connection module M2.

Figure 4:
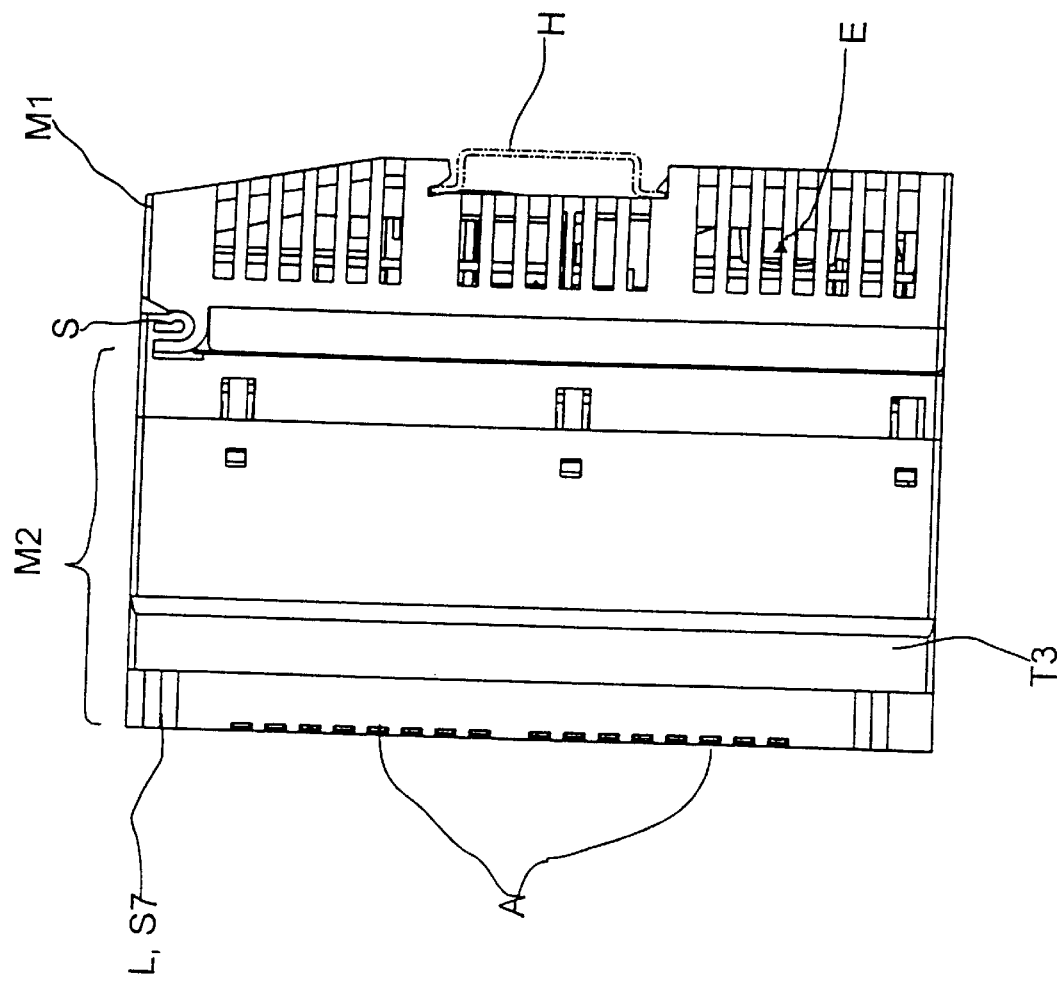
FIG. 4 shows an exemplary illustration of the decentralized module from the side, including the base module having the controllable electronic circuit, and the attached connection module.
Figure 5:
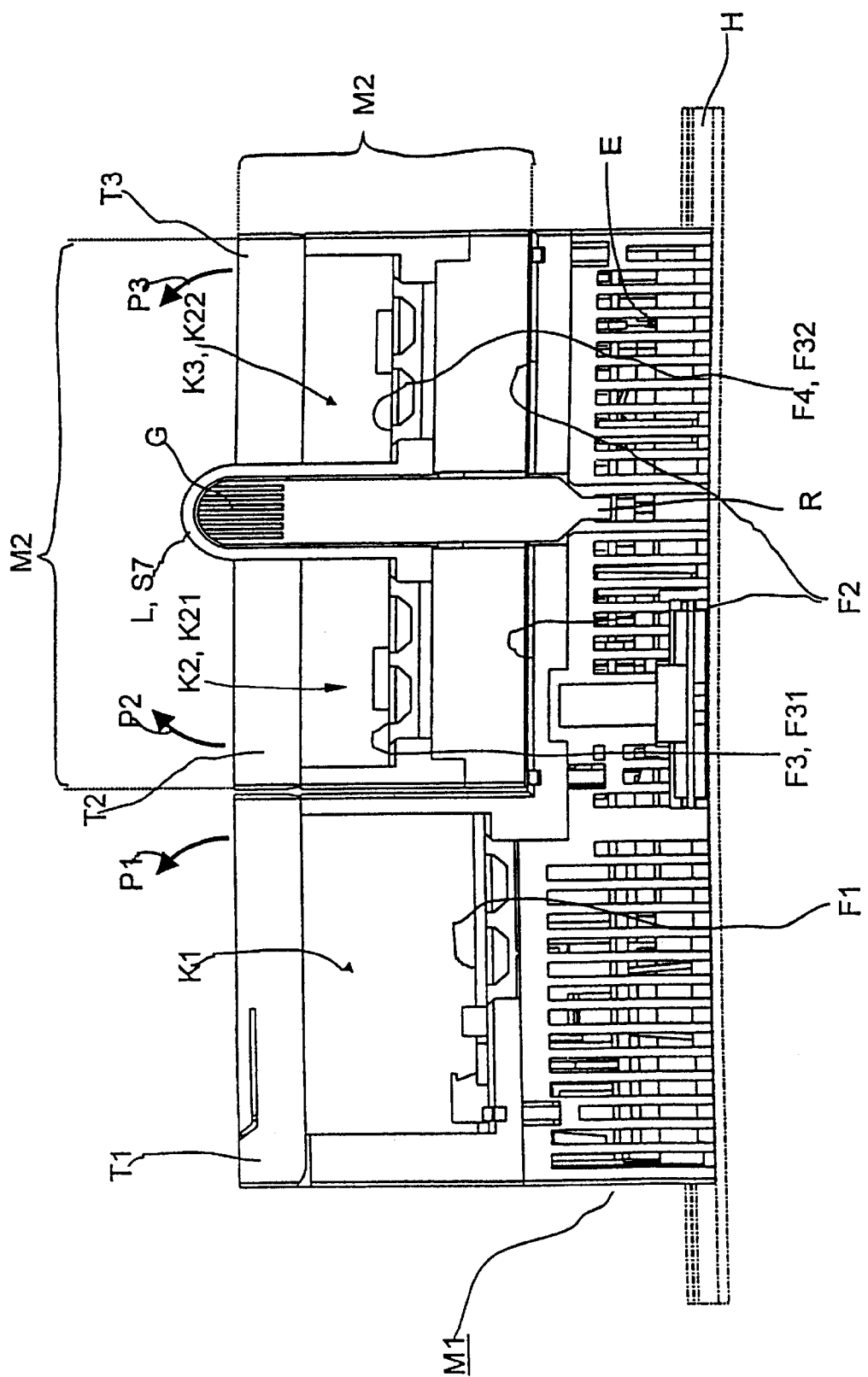
FIG. 5 shows an exemplary illustration of the decentralized module from below, including the cable channels of the connection module and of the base module.

FIGS. 4 and 5 show further exemplary illustrations of the decentralized module in a view from the side and in a view from below. These show flat base module M1 which can be attached to a fastening element H and in which electronic circuit E is arranged. Connection module M2 is in this case attached to base module M1 with electrical contact being made. In addition, the side view in FIG. 4 shows the half-moon-shaped covering strip L and partition S7, designed in the form of a column, having signal devices A and third door T3. In an advantageous embodiment of the decentralized module according to the present invention, latching means are provided for attaching connection module M2 to base module M1. The latching means are denoted by reference symbol S in FIG. 4 and reference symbol R in FIG. 5. In this case, the latching means have, in particular, a half-open hinge S and a latching clasp R. Latching clasp R is arranged, in particular, on connection module M2 and latches onto base module M1. By way of example, latching clasp R is in this case arranged on a spring-loaded gripping piece G which can tilt, so that ease of use is achieved when latching and releasing connection module M2 onto/from base module M1.

For reasons of clarity, FIG. 5 once again shows, by way of example, flat base module M1 which can be attached to fastening element H and has electronic circuit E. In this case, base module M1 has first termination panel F1 including first cable channel K1 and first door T1. In addition, base module M1 has termination panel F2, which is arranged next to first termination panel F1 and is used to attach connection module M2. This has the half-moon-shaped covering strip L and partition S7 designed in the form of a column. In addition, third and fourth termination panels F3 and F4 and two panel sections F31 and F32, as well as second and third cable channels K2 and K3 and two partial cable channels K21 and K22 all of which are part of connection module M2, are shown. By way of example, the opening directions of first, second and third doors T1, T2 and T3 are indicated by arrows which are denoted by reference symbols P1, P2 and P3.

What is claimed is:

1. A decentralized module for bringing together and distributing signal lines for electrical process signals, comprising:
   a flat base module having an electrical interface for connecting the decentralized module to a data bus;
   a connection module for electrically connecting to the signal lines, the connection module being removably attached to the base module;
   an electronic circuit controlled via the data bus, wherein when the connection module is latched to the base module, the electronic circuit electrically couples the signal lines and the electrical interface of the base module to the data bus;
   a first termination panel which includes the electrical interface, the first termination panel for connecting the decentralized module to the data bus, and having a first side wall on a first side and a second side wall on a second side, the first side being opposite to the second side, the first side wall and the second side wall forming a first cable channel; and
   a second termination panel arranged next to the first termination panel, the second termination panel for attaching the connection module.

2. The decentralized module according to claim 1, further comprising:
   a first door swing-mounted on one of the first side wall and the second side wall, the first door covering the first cable channel.

3. The decentralized module according to claim 1, wherein the connection module includes a third termination panel, the third termination panel including a first electrical connection arrangement for the signal lines.

4. The decentralized module according to claim 3, wherein the third termination panel has a third side wall on a third side and a fourth side wall on a fourth side, the third side being opposite to the fourth side of the termination patent, the third side wall and the fourth side wall forming a second cable channel.

5. The decentralized module according to claim 4, further comprising:
   a second door swing-mounted on one of the third side wall and the fourth side wall, the second door covering the second cable channel.

6. The decentralized module according to claim 5, wherein the connection module includes a fourth termination panel arranged next to the third termination panel, the fourth termination having a second electrical connection arrangement for the signal lines.

7. The decentralized module according to claim 6, wherein the fourth termination patent has a fifth side wall on a fifth side and a sixth side wall on a sixth side, the fifth side being opposite to the sixth wall, the fifth side wall and the sixth side wall forming a third cable channel.

8. The decentralized module according to claim 7, further comprising:
   a third door swing-mounted on one of the fifth side wall and the sixth side wall, the third door covering the third cable channel.

9. The decentralized module according to claim 8, further comprising:
   a crescent-shaped covering strip attached to the fourth side wall and fifth side wall.

10. The decentralized module according to claim 9, wherein the second door and the third door are swing-mounted one the crescent-shaped covering strip, the crescent-shaped covering strip being snap-fitting.

11. The decentralized module according to claim 9, further comprising:
    signal devices associated with individual ones of the signal lines, the signal devices being arranged on the crescent-shaped covering strip.

12. The decentralized module according to claim 3, wherein the termination panel is divided into two panel sections by a partition having a column form.

13. The decentralized module according to claim 12, wherein the third termination panel includes a third side wall on a third side and a fourth side wall on a fourth side, the third side being opposite to the fourth side, the third side wall and the fourth side wall forming a second cable channel, the partition dividing the second cable channel into two partial cable channels.

14. The decentralized module according to claim 13, further comprising:
    a second door and a third door, each of the second door and the third door being swing-mounted on the partition.

15. The decentralized module according to claim 14, further comprising:
    signal devices associated with individual ones of the signal lines, the signal devices being arrange on the partition.

16. The decentralized module according to claim 15, wherein the first electrical connection arrangement is designed as terminal strips for making electrical contact with the signal lines.

17. The decentralized module according to claim 16, wherein the electronic circuit activates individual ones of the signal lines as one of input signal lines and output signal lines.

18. The decentralized module according to claim 1, wherein the base module is attachable to a fastening element, the fastening element being a top-hat rail.

19. The decentralized module according to claim 1, further comprising:

a latching arrangement for attaching the connecting module to the base module.

* * * * *